US008913245B2

(12) United States Patent
Shiran (10) Patent No.: US 8,913,245 B2
(45) Date of Patent: Dec. 16, 2014

(54) SYSTEM AND METHOD FOR INTERFEROMETRIC AUTOFOCUSING

(75) Inventor: Eran Shiran, Yokneam Illit (IL)

(73) Assignee: KLA-Tencor Corporation, Milpitas, CA (US)

(*) Notice: Subject to any disclaimer, the term of this patent is extended or adjusted under 35 U.S.C. 154(b) by 388 days.

(21) Appl. No.: 13/159,917

(22) Filed: Jun. 14, 2011

(65) Prior Publication Data

US 2011/0317168 A1    Dec. 29, 2011

Related U.S. Application Data (60) Provisional application No. 61/359,442, filed on Jun. 29, 2010.

(51) Int. Cl.
*G01B 9/02* (2006.01)
*G01B 11/06* (2006.01)
*G03F 7/20* (2006.01)

(52) U.S. Cl.
CPC ........ *G01B 9/02068* (2013.01); *G01B 9/02063* (2013.01); *G01B 11/0608* (2013.01); *G01B 2210/56* (2013.01); *G03F 7/7065* (2013.01); *G03F 7/70625* (2013.01); *G03F 7/70633* (2013.01); *G01B 9/0209* (2013.01)
USPC ....................................................... 356/450

(58) Field of Classification Search
USPC .......................................... 356/450, 511–516
See application file for complete search history.

(56) References Cited

U.S. PATENT DOCUMENTS

| 4,493,555 | A | | 1/1985 | Reynolds |
| 4,651,315 | A | * | 3/1987 | Laude ............................. 398/88 |
| 5,892,991 | A | * | 4/1999 | Hamada et al. ................ 396/147 |
| 6,172,349 | B1 | | 1/2001 | Katz et al. |
| 6,545,761 | B1 | | 4/2003 | Aziz et al. |
| 7,109,459 | B2 | * | 9/2006 | Kam et al. .................. 250/201.4 |

* cited by examiner

*Primary Examiner* — Kara E Geisel
*Assistant Examiner* — Maurice Smith
(74) *Attorney, Agent, or Firm* — Suiter Swantz pc llo (57) ABSTRACT

The present invention includes a camera configured to collect light reflected from the surface of a specimen, a two beam interference optical system including: an illumination source; a reference mirror configured to reflect substantially less light from a center region than from a peripheral region; and a first beam splitter configured to direct a first portion of light from the illumination source along an object path and a second portion of light from the illumination source along a reference path, wherein the camera and reference mirror are arranged such that light reflected from the reference mirror does not impinge on a FOV of the camera; and an autofocusing system disposed along a secondary optical axis, wherein the autofocusing system is configured to analyze one or more interference fringes created by a superposition of light reflected from the specimen surface and the peripheral region of the reference mirror surface.

18 Claims, 4 Drawing Sheets

SYSTEM AND METHOD FOR INTERFEROMETRIC AUTOFOCUSING

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

Related Applications

For purposes of the USPTO extra-statutory requirements, the present application constitutes a regular (non-provisional) patent application of United States Provisional Patent Application entitled MODIFIED INTERFEROMETRIC AUTOFOCUSING, naming Eran Shiran as inventor, filed Jun. 29, 2010, Application Ser. No. 61/359,442.

TECHNICAL FIELD

The present invention generally relates to automatic optical focusing and more particularly to autofocusing utilizing a two beam interference optical system configured to provide independent operation of imaging and autofocus functions.

BACKGROUND

As semiconductor device features continue to shrink, manufacturers have increasingly turned to optical techniques to perform non-destructive inspection and analysis of semiconductor wafers at various stages throughout a semiconductor fabrication process. One such non-destructive method includes optical based coherence probe microscopy. Coherence probe microscopy involves measuring the mutual coherence between a light wave reflecting from a reference object (e.g., reference mirror) and a light wave reflecting from the surface of a specimen using a two-beam interference based microscope. In a typical coherence probe measurement, a pin diode array (PDA) covering a portion of a field of view (FOV) may be utilized to detect the coherence of light reflected from an area of a surface of a specimen to be inspected. In this manner, a CCD camera may be utilized to image the surface of a given specimen, while the PDA is utilized for coherence analysis.

Autofocusing in such a system may be achieved by scanning the image in the Z-direction (i.e., along the primary optical axis) which provides interference intensity (as measured by the PDA) versus Z-position information. The interference intensity information may then be analyzed using software executed by a processor (e.g., computer system) communicatively coupled to the PDA in order to determine the best focus position. In this manner, the Z-position dependence of the intensity of interference fringes created by the superposition of light waves from a reference path and an object path of the two-beam microscope may be measured and analyzed. The Archer 100 tool manufactured by KLA-Tencor represents a system capable of carrying out traditional autofocusing in a two-beam interference microscope configuration.

In a traditional autofocusing two-beam interference microscopy arrangement, the CCD camera typically images the surface of the specimen only after autofocusing has been achieved utilizing the PDA and an associated computer system. In order to carry out CCD imaging following an autofocusing process, a controllable shutter system is positioned in the reference path. In this manner, the light beam reflecting from the surface of a reference mirror may be selectably blocked using the shutter system. Upon closing the shutter, the interference fringes will cease to appear at the CCD imaging plane as light from the reference path is no longer allowed to interfere with light from the object path. The camera may then image the surface of the specimen without the appearance of interference fringes in the field of view (FOV) of the camera.

The above described autofocusing and imaging process, however, requires a time delay. The CCD measurement may only image the surface of the specimen after the shutter system ceases to move and after residual vibrations within the system have stopped. For example, a system may require up to 40 to 50 milliseconds for shutter related vibrations to dissipate to a level required for subsequent CCD imaging. When integrated over an entire sampling process, this time delay may be significant. In some instances, the time delay required for shutter related vibrational noise to leave the system may represent up to 10% of the move-acquire-measure (MAM) time associated with a given measurement process.

It is therefore desirable to provide a two-beam interference autofocusing system capable of performing CCD imaging measurements without the need of a reference beam shutter.

SUMMARY

An apparatus suitable for interferometric autofocusing is disclosed. In one aspect, an apparatus may include, but is not limited to, a camera disposed along a primary optical axis, wherein the camera is configured to collect a portion of light reflected from a surface of one or more specimens disposed on a specimen stage; a two beam interference optical system, wherein the two beam interference optical system includes: an illumination source; a reference mirror configured to reflect substantially less light from a center region than from a peripheral region; and a first beam splitter configured to direct a first portion of light from the illumination source along an object path to the surface of one or more specimens disposed on the specimen stage and a second portion of light from the illumination source along a reference path to the surface of the reference mirror, wherein the first beam splitter is configured to direct a portion of light reflected from the surface of the reference mirror along a primary optical axis, wherein the camera and reference mirror are arranged such that light reflected from the reference mirror does not impinge on a field of view (FOV) of the camera; an autofocusing system disposed along a secondary optical axis, wherein the autofocusing system is configured to analyze one or more interference fringes created by a superposition of light reflected from the surface of the specimen and light reflected from the peripheral region of the surface of the reference mirror.

In another aspect, the apparatus may include, but is not limited to, a camera disposed along a primary optical axis, wherein the camera is configured to collect a portion of light reflected from a surface of one or more specimens disposed on a specimen stage; a two beam interference optical system, wherein the two beam interference optical system includes: an illumination source; a reference mirror; a first beam splitter configured to direct a first portion of light from the illumination source along an object path to the surface of one or more specimens disposed on the specimen stage and a second portion of light from the illumination source along a reference path toward the reference mirror; and a ninety degree mirror positioned along the reference path between the illumination source and the reference mirror, wherein the ninety degree mirror is configured to divert light impinging on the ninety degree mirror from the reference path along a direction substantially perpendicular to the reference path such that substantially no light from the reference path impinges a central region of the reference mirror; wherein the first beam splitter is configured to direct a portion of light reflected from the surface of the reference mirror along a primary optical axis, wherein the camera and reference mirror are arranged such that light reflected from the reference mirror does not impinge on a field of view (FOV) of the camera; an autofocusing system disposed along a secondary optical axis, wherein the autofocusing system is configured to analyze one or more interference fringes created by a superposition of light reflected from the surface of the specimen and light reflected from a peripheral region of the surface of the reference mirror.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to the subject matter disclosed, which is illustrated in the accompanying drawings.

Referring generally to FIGS. 1A through 1D, a system 100 for interferometric autofocusing is described in accordance with the present invention. The utilization of a two-beam interference microscope system having a shutter-less reference path may decrease the time required to perform imaging and autofocusing routines performed via the system. The present invention is directed at a system 100 capable of carrying out an imaging and autofocusing routine without the requirement of a shutter situated along a reference path of the associated two-beam interference system of the system 100. In this manner, the system 100 may include a modified reference mirror 120 having a central region 121 configured to reflect substantially less light than a peripheral region 119 of the mirror 120. As such, imaging of the surface of the specimen 102 may be carried out via a camera 116 (e.g., CCD camera) immediately following an autofocusing routine carried out via the autofocusing system 124 (e.g., pin diode array) of the system 100.

It is contemplated herein that the present invention may consist (but not required to consist) of adapting or reconfiguring presently existing two-beam interference based autofocusing microscopy systems, such as the KLA-Tencor Archer 100 tool. For example, the shutter and reference mirror of a traditional system (e.g., Archer 100 system) may be replaced with the modified reference mirror 120 of the present invention. It should be recognized that the present invention is not limited to an adaptation of an Archer 100 system, but rather the description above should be interpreted merely as an illustration. It is anticipated that the present invention may be extended to a wide variety of autofocusing systems.

Figure 1A:
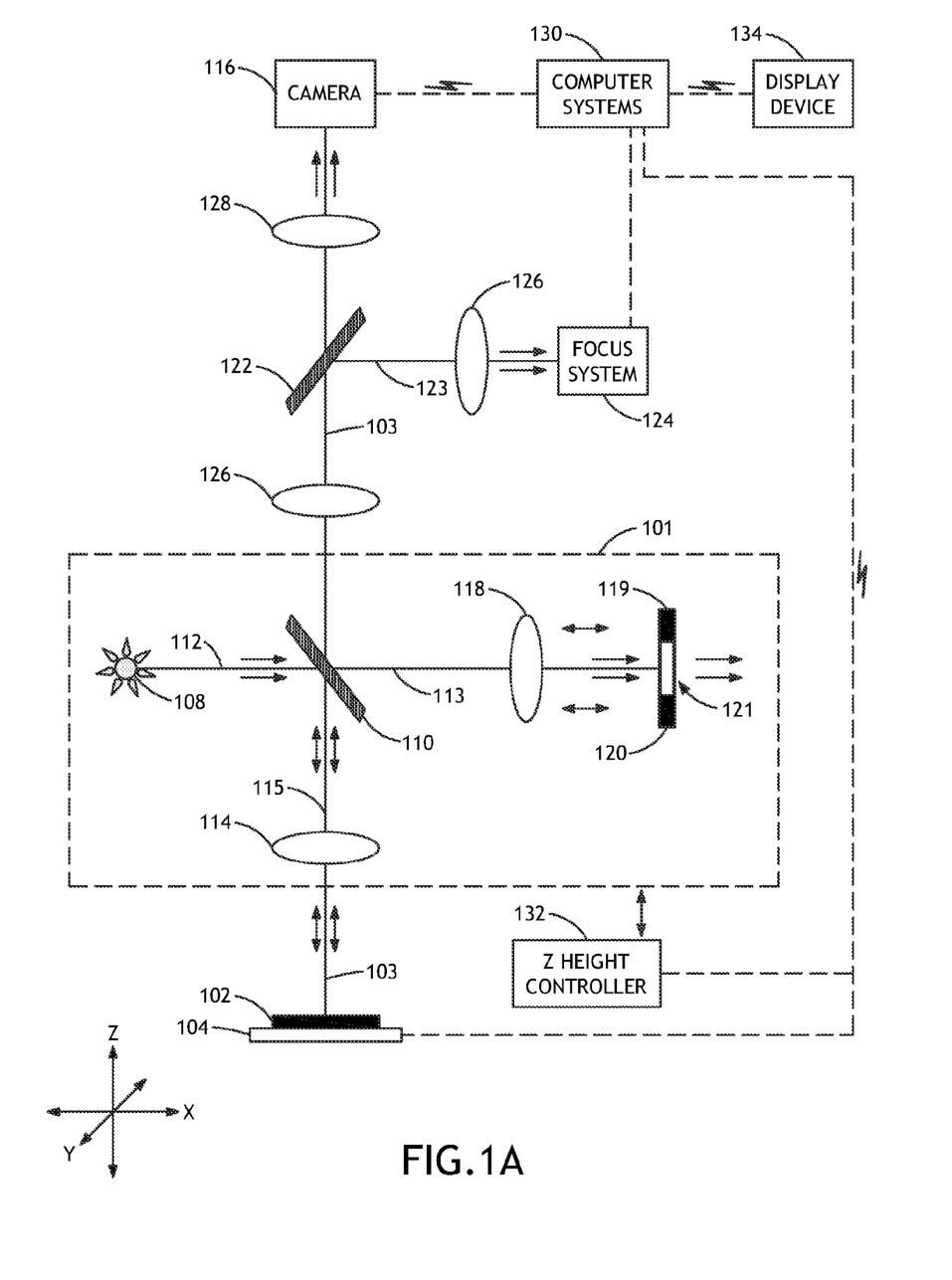
FIG. 1A illustrates a block diagram of an apparatus suitable for interferometric autofocusing in accordance with the present invention.

Referring now to FIG. 1A, the system 100 may include a two beam interference optical system 101, a camera disposed along a primary optical axis 103 of the system 100, and an autofocusing system 124 disposed along a secondary optical axis 123 of the system 100.

In one aspect of the present invention, a specimen 102 may be disposed on a specimen stage 104. In one embodiment, the specimen stage 104 may include a translatable (e.g., X-Y translatable stage) and/or rotatable (e.g., theta rotatable stage) controllable via the computer system 130. The specimen 102 and stage 104 may be arranged such that the specimen 102 lies substantially perpendicular to the primary optical axis 103 of the system 100.

In another aspect, the two-beam interference optical system 101 of the system 100 may include an illumination source 108, a reference mirror 120, and a first beam splitter 110. In a general sense, the two-beam interference optical system 101 of the system 100 may be configured as a Linnik interferometer. Linnik interferometry is described generally in U.S. Pat. No. 4,818,110, issued on Apr. 4, 1989, and U.S. Pat. No. 6,172,349, issued on Jan. 9, 2001, which are incorporated herein by reference. The illumination source 108 of the two-beam interference system 101 may include any illumination source known in the art. In one embodiment, the illumination source 108 may include a broadband light source (e.g., white light source). For example, the illumination source 108 may include, but is not limited to, a halogen light source (HLS). For instance, the halogen light source may include, but is not limited to, a tungsten based halogen lamp. In another example, the illumination source 108 may include a Xenon arc lamp.

In another aspect of the present invention, the first beam splitter 110 of the two-beam interference system 101 may split the light beam emanating from an illumination source 108 into two paths: an object path 115 and a reference path 113. In this sense, the first beam splitter 110 directs a portion of the beam of light emanating from the illumination source 108 to the surface of the specimen 102 (e.g., via object path 115) disposed on the stage 104, while allowing another portion of the light emanating from the illumination source 108 to pass through to the reference mirror 120 (e.g., via reference path 113). Any beam splitter known in the art is suitable for implementation as the first beam splitter 110 of the present invention. In a general sense, as discussed in greater detail further herein, in a two-beam interference microscope, a light wave emanating from an illumination source impinging on an image plane of an associated camera or detector represents the superposition of an object wave and a reference wave, wherein the object wave is reflected from the surface of a specimen and the reference wave is reflected from the surface of a reference mirror.

In a further embodiment, the two-beam interference optical system 101 may include a main objective lens 114. The main objective lens 114 may aid in directing light along the object path 115 to the surface of the specimen 102 disposed on the specimen stage 104. For example, the beam splitter 110 may direct a portion of the light beam 112 emanating from the illumination source 108 along the object path 115. Following the splitting process by the first beam splitter 110, the main objective lens 114 may focus light from the object path 115, which is collinear with the primary optical axis 103, onto the surface of the specimen 102. In a general sense, any objective lens known in the art may be suitable for implementation as the main objective lens 114 of the present invention.

As will be discussed in more detail further herein, a portion of the light impinging on the surface of the specimen 102 may be reflected by the specimen 102 and directed along the primary optical axis 103 via the objective 114, the beam splitter 110, an intermediate lens 126, a second beam splitter 122, and an imaging lens 128.

In another embodiment, the two-beam interference optical system 101 may include a reference objective lens 118. The reference objective lens 118 may aid in directing light along the reference path 113 to the surface of the reference mirror 120. In a general sense, any objective lens known in the art may be suitable for implementation as the reference objective lens 118 of the present invention.

Following the splitting process by the first beam splitter 110, the reference objective lens 118 may focus light from the reference path 115, which is collinear with the illumination path 112, and substantially perpendicular to the primary optical axis 103, onto the surface of the reference mirror 120.

In another aspect of the present invention, the reference mirror 120 of the two-beam interference optical system 101 is configured to have zero or approximately zero reflectance at its center region 121. In this manner, as shown in FIG. 1A, only light impinging on the peripheral portions 119 of the reference mirror 120 may reflect light from the surface plane of the reference mirror 120. In contrast, light impinging the surface of the reference mirror 120 at the center region 121 of the mirror will fail to reflect light, at least significantly, from the mirror 120 surface.

Figure 1B:
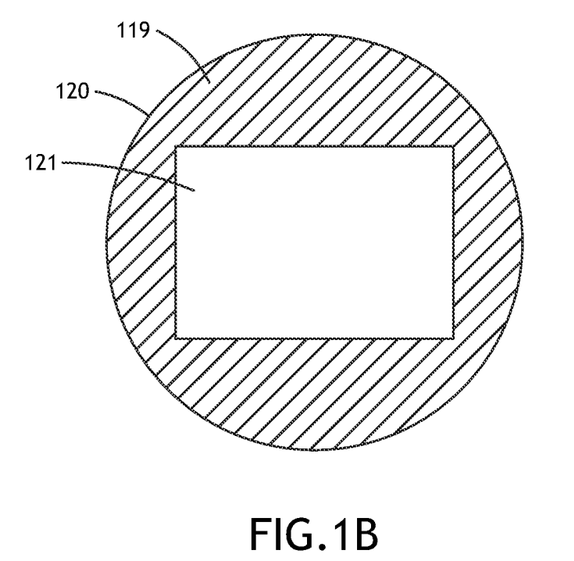
FIG. 1B illustrates a top plan schematic view of a modified reference mirror in accordance with the present invention.
Figure 1C:
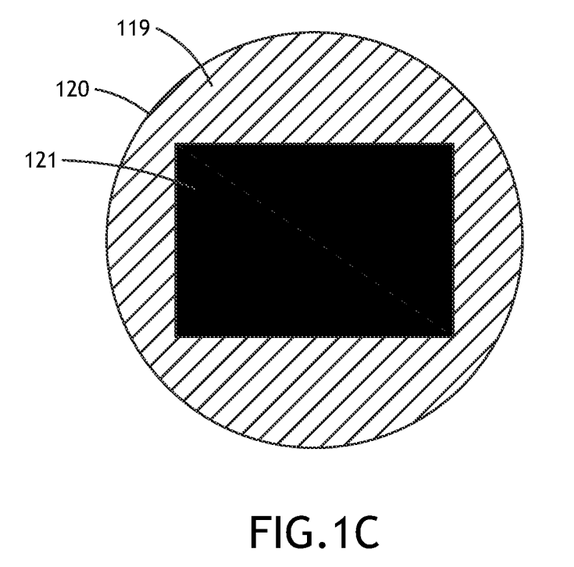
FIG. 1C illustrates a top plan schematic view of a modified reference mirror in accordance with the present invention.

FIGS. 1B and 1C illustrate embodiments of a reference mirror 120 having zero or approximately zero central reflectance. For example, as shown in FIG. 1B, the reference mirror 120 may include a planar mirror having a rectangular shaped opening at its center region 121. In this manner, light incident upon the mirror at the rectangular central region 121 of the mirror 120 will pass through the mirror, as depicted in FIG. 1A. By way of another example, as shown in FIG. 1C, the reference mirror 120 may include a planar mirror having a rectangular shaped central region having a low reflectance. For instance, the central region having a low reflectance may be formed utilizing a coating which is highly absorptive in the implemented frequency range (e.g., optical frequencies). One example of such a material is a "black" coating, which may be applied the surface of a planar reference mirror 120. Commercially available (e.g., ACKTAR Ltd.) black coatings providing reflectances between 0.5 and 2% are readily available. In this manner, light incident upon the mirror at the rectangular central region 121 of the mirror 120 will be substantially absorbed by the applied "black" coating.

Figure 1D:
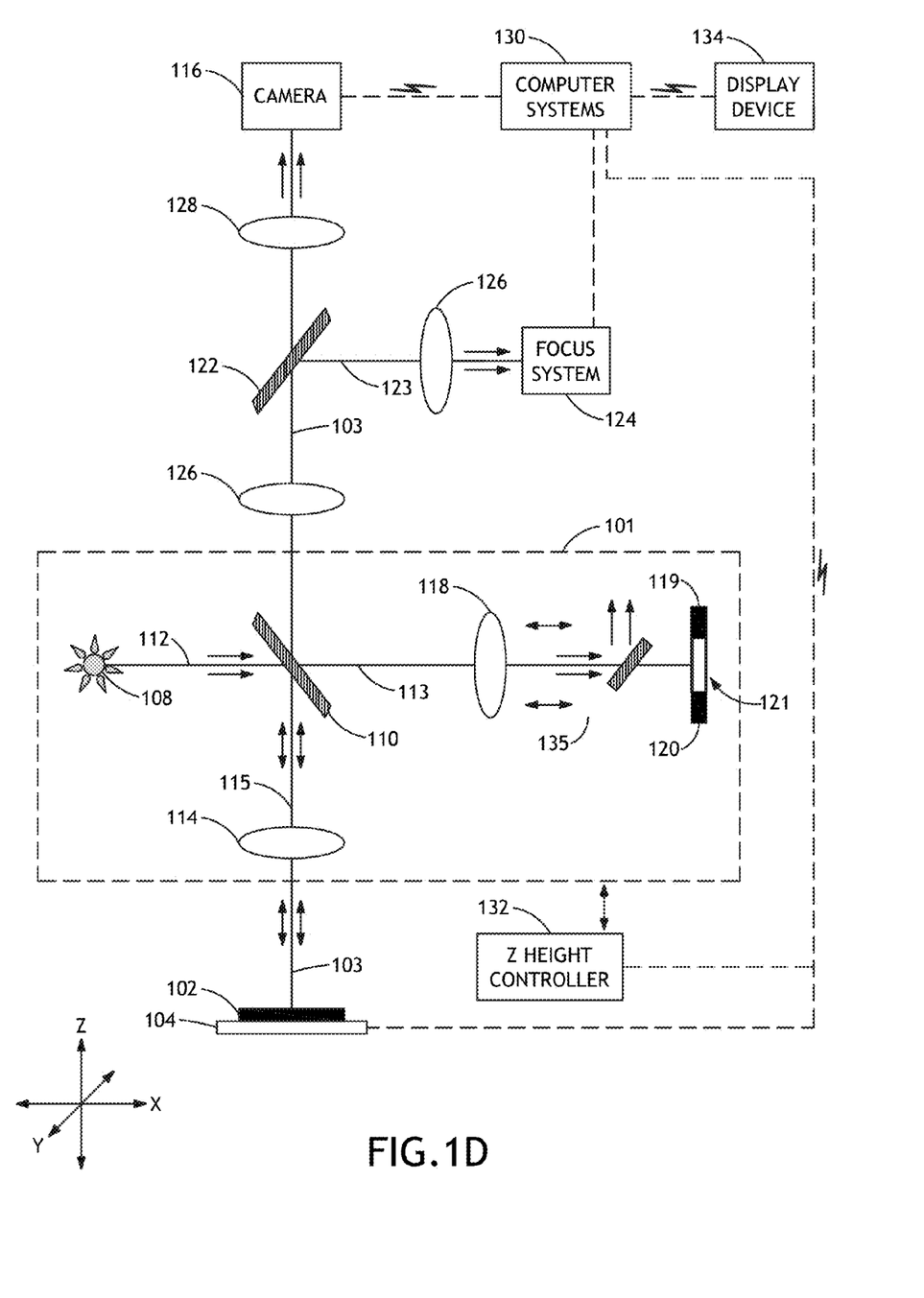
FIG. 1D illustrates a block diagram of an apparatus suitable for interferometric autofocusing, equipped with a 90 degree mirror, in accordance with the present invention.

It is further contemplated that the non-reflective central region 121 of the mirror may be accomplished by diverting light traveling toward the reference mirror 120 from the reference path 113 utilizing any means known in the art. For example, as shown in FIG. 1D, a 90 degree mirror 135 may be utilized to divert light directed toward the central region 121 of the mirror along a direction perpendicular to the reference path 113. For instance, a 90 degree square mirror 135 may be situated along the reference path 113 in front of the reference mirror 120. In this manner, light impinging on the mirror may be directed along a direction perpendicular to the reference path 113. In doing so, light traveling along the reference path 113 will not impinge the reference mirror 120 at the central region 121 of the reference mirror 120, and, thus, no light will reflect from the central region 121 of the reference mirror 120.

In the above described instances, the reference mirror 120 displays a reflectance profile that is maximized at the peripheral regions 119 of the mirror 120 and zero or nearly zero at the central region 121 of the mirror 120. The above description should not be interpreted as a limitation but merely an illustration as it is contemplated that numerous equivalent means to achieve zero or approximately zero reflectance at the center of the mirror 120 may exist. In a general sense, any means known in the art to limit the reflection of light from the central region 121 of the reference mirror 120 may be utilized in the context of the present invention.

Moreover, the above description relating to the geometric shape of the mirror 120 or the central region 121 should not be considered a limitation as it is contemplated herein that a variety of shapes and sizes are suitable for implementation in the present invention. Furthermore, the relative surface areas of the central region 121 and the peripheral region 119, as displayed in FIGS. 1B and 1C, should not be interpreted as a limitation. It is contemplated herein that in some instances the surface area of the central region 121 may exceed the surface area of the peripheral regions 119, while in other instances the surface area of the peripheral region 119 may exceed the surface area of the central region 120, while yet in other instances the two surfaces areas may be substantially equivalent.

In another aspect of the present invention, the camera 116 of the system 100 may be disposed along the primary optical axis 103. In this regard, the camera 116 may be arranged to collect imagery data from the surface of the specimen 102. For example, in a general sense, after reflecting from the surface of the specimen 102, light may travel along the primary optical axis 103 to the image plane of the camera 116 via the main objective 114, the first beam splitter 110, the intermediate objective 126, the second beam splitter 122, and the imaging lens 128. It is recognized that any camera system known in the art is suitable for implementation in the present invention. For example, the camera 116 may include a charge coupled device (CCD) based camera system. By way of another example, the camera 116 may include a time delay integration (TDI)-CCD based camera system. In a further aspect, the camera 116 may be communicatively coupled with a computer system 130. In this regard, digitized imagery data may be transmitted from the camera 130 to the computer system 116 via a signal, such as a wireline signal (e.g., copper line, fiber optic cable, and the like) or a wireless signal (e.g., wireless RF signal).

While the above description describes the camera 116 as being located along the primary optical axis 103 of the system 100, this characteristic should not be interpreted as a requirement. It is contemplated herein that the camera 116 may reside along an additional optical axis (not shown) of the system 100. For example, an additional beam splitter (not shown) may be utilized to divert a portion of light reflected from the surface of the specimen 102 and traveling along the primary optical axis 103 along an additional optical axis. The camera 116 may be arranged such that light traveling along the additional optical axis impinges the image plane of the camera 116.

In another aspect of the present invention, the autofocusing system 124 of the system 100 may be disposed along a secondary optical axis 123. A portion of light traveling from the first beam splitter 110 along the primary optical axis toward the camera 116 may be directed along a secondary optical axis 123 via a second beam splitter 122. In this regard, a portion of the light recombined by the first beam splitter 110, as discussed in more detail further herein, may be redirected along the secondary optical axis 123 toward the autofocus system 124 via the second beam splitter 122, while the remaining portion of light may pass through the second beam splitter 122 to the image plane of the camera 116. In this regard, the autofocus system 124 may be arranged such that the recombined waveforms from the surface of the specimen 102 and the reference mirror 120 are imaged onto the image plane of the autofocusing system 124. In a further embodiment, the system 100 may include a lens 126 configured to aid in imaging light directed from the second beam splitter 122 onto the image plane of the autofocusing system 124.

In one embodiment, the autofocusing system 124 may include a pin diode array (PDA). For example, the PDA of the system 100 may include a plurality of square shaped detectors each having a separate electrical output that produces a current proportional to the energy impinging on the corresponding detector. The above description should not be interpreted as a limitation but rather merely as an illustration as it is contemplated that various PDA arrangements may be utilized in the context of the present invention. A PDA system suitable for implementation in the present invention may be obtained, for example, from Centronic Limited, Electo Optics Division.

In a further aspect, the autofocusing system 124 may be communicatively coupled to a computer system 130. In this regard, a digitized signal indicative of the electrical output of each of the detectors of the diode array may be transmitted from the autofocusing system 124 to the computer system 130 via a signal, such as a wireline signal (e.g., copper line, fiber optic cable, and the like) or a wireless signal (e.g., wireless RF signal). The computer system 130 may then apply a known best focus algorithm to the measured autofocus data in order to determine a best focus Z position. Particular aspects of pin diode array autofocusing are generally described in U.S. Pat. No. 6,172,349, issued on Jan. 9, 2001, which is incorporated above by reference.

Focusing of the system 100 is performed by moving an assembly 101 along the Z-direction, which is parallel to the primary optical axis 103, according to the determined best focus position determined by the computer 130. The computer system 130 may control the vertical translation of the assembly 101 by a motor (e.g., servo) for macro-movements or by piezoelectric (e.g., PZT) actuation for micro-movements. Moreover, a sensor (not shown) may be attached to the assembly 101 and measures the vertical displacement of the assembly 101 relative to an established linear scale. The output of the sensor may then be transmitted to the computer system 130, allowing the computer system 130 to determine when the targeted focus height has been achieved.

In a general sense, autofocusing of the system 100 is carried out by scanning the image in the Z-direction and collecting interference intensity data utilizing the autofocusing system 124 (e.g., pin diode array) and computer system 130 at numerous Z positions. Then, utilizing a pre-programmed best focus algorithm configured to determine the coherence between the reference wave reflecting from the reference mirror and the object wave reflecting from the specimen, the computer system 100 may determine the position of best focus. Autofocusing is generally described in U.S. Pat. No. 6,172,349, issued on Jan. 9, 2001, which is incorporated above by reference.

Referring again to FIG. 1A, as light from the reference path 113 impinges on the surface of the reference mirror 120 only light incident upon the peripheral regions 119 of the mirror 120 will reflect back along the reference path 113 toward the first beam splitter 110. The first beam splitter 110 may then recombine the beam reflected from the surface of the specimen 102 (from the object path 115) with the light reflected from the surface of the reference mirror 120 (from reference path 113) and direct the waveforms along the primary axis 103 toward the camera 116 and the secondary beam splitter 122 associated with the autofocusing system 124. In this sense, a light wave reaching an image plane (e.g., image plane of camera 116 or image plane of autofocusing system 124) is the sum of the waveforms reflecting from the surface of the specimen 102 and the waveform reflecting from the reference mirror 120.

In a general sense, in the situation where light reflected from the peripheral portions 119 of the reference mirror 120 combines with light reflected from the surface of the specimen interference fringes may be observed in the corresponding images at a given image plane. In the case of a broadband illumination source 108, the strongest "fringing" occurs when the path difference between the reference path 113 and the object path 115 is small. For example, the path difference required to observe strong interference in the context of a broadband illumination source is on the order of a fraction of the average wavelength, due to white light's short coherence length. The measurement of interference fringes in Linnik based interferometer systems is described generally in U.S. Pat. No. 4,818,110, issued on Apr. 4, 1989, and U.S. Pat. No. 6,172,349, issued on Jan. 9, 2001, which are incorporated above by reference.

In another aspect of the present invention, as illustrated in FIG. 1D, the reference mirror 120 and the camera 116 may be arranged such that light reflecting from the peripheral regions 119 of the reference mirror 120 does not enter the field of view (FOV) 140 of the camera 116. Moreover, since no light emanates from the central region 121 of the reference mirror 120 (i.e., due to opening or blackening), no light from the reference mirror 120 will enter the FOV of the camera 116. As such, no interference fringes 136 resulting from the superposition of reference mirror light and specimen light will be present in the FOV 140 of the camera 116.

In another aspect of the present invention, as illustrated in FIG. 1D, the autofocusing system 124 may sample the peripheral portions 138 of the image resulting from the recombination of light from the surface of the specimen 102 and the reference mirror 120. For example, a PDA may utilize the interference fringes 136 of the peripheral regions 138 of the projected image in order to carry out coherence measurements.

Figure 1E:
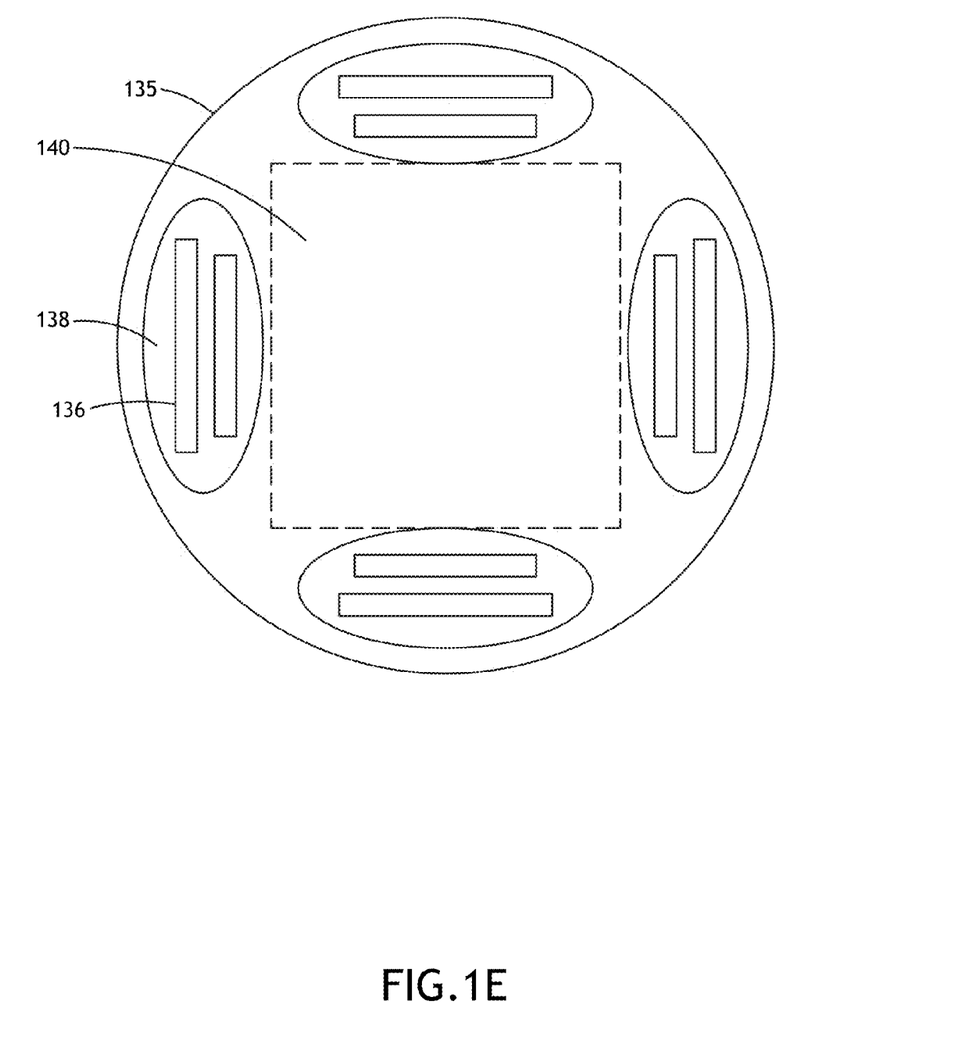
FIG. 1E illustrates an illustration of the image scene as projected onto the image plane of the camera or autofocusing system in accordance with the present invention.

FIG. 1E illustrates a recombined image 135 constructed via the superposition of light from the reference wafer 120 and the specimen 102. The dotted box 140 illustrates the FOV of the camera 116, which is void of interference fringes due to the absence of light reflected from the reference mirror 120 in that region. The oval figures 138 represent the autofocusing system 124 sampling regions. The sampling regions 138 contain within them one or more interference fringes created due to the superposition of light from the peripheral regions 119 of the reference mirror 120 and the surface of the specimen 102. The above description associated with FIG. 1E should not be considered a limitation but rather merely an illustration. It is contemplated herein that a variety of reference mirror and FOV configurations may be implemented in the context of the present invention. Therefore, the present invention is not limited to the geometrical arrangement as depicted in FIG. 1E. It is recognized herein that because the available sampling area for a given autofocusing system 124 (e.g., PDA) is reduced due to the void 140 created by the modified reference mirror 120 it is possible the signal-to-noise ratio for a given autofocusing measurement may be reduced relative to shutter based autofocusing measurements described in the prior art.

It is further contemplated herein that the configuration described above allows the camera 116 of the system 100 to image a portion of the specimen using the fringe-less FOV 140 of the camera, while the autofocus system 124 simultaneously analyzes interference fringes 136 in the peripheral regions of the image 138. In contrast, in traditional systems in the prior art, an imaging step by a camera cannot be carried out until a shutter system engages, which acts to block the light emanating from a reference mirror. In the present invention, the use of the reference mirror 120 having a central region 121 with zero or near-zero reflectance allows a user to operate the camera 116 and autofocus systems 124 independently.

Moreover, the above described system provides the ability to monitor the focus of the system during a measurement process. In this regard, a user may monitor the focus of the system 100 by monitoring the interference fringes 136 in the peripheral regions 138 of the image utilizing the autofocus system 124, while imagery data is capture via the camera 116. In this sense, in the event the system drifts out of focus, the computer system 130 may correct the focus height using the height controller 132. This potentially avoids the tedious task of "re-imaging" following a focus drift, which is only discovered after the imaging process in traditional systems.

Furthermore, the present invention reduces the mechanical complexity of the measure device. For example, in traditional systems in the prior art, following an autofocusing process via a PDA and prior to image capture via a CCD, a shutter is required to block the light reflecting from a reference mirror. The time required to close the shutter and allow residual vibrations to dissipate may take up to 40-50 ms. When integrated over the numerous measurements performed, the time devoted to shutter operation alone may account for 8-10% of the total move-acquire-measure time of the system. The present invention allows for the immediate capture of image data following an autofocusing process, potentially reducing the time needed for sample processing by an additional 10%. It should be recognized by those skilled in the art that the precise amount of move-acquire-measure time and the shutter time is highly dependent upon the specific system implement. In a general sense, however, the present invention provides substantial time savings due the ability of the system 100 to perform measurements without the need of a shutter.

All of the system and methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

Furthermore, it is to be understood that the invention is defined by the appended claims.

What is claimed:

1. An apparatus suitable for interferometric autofocusing, comprising:
   a camera disposed along a primary optical axis, wherein the camera is configured to collect a portion of light reflected from a surface of one or more specimens disposed on a specimen stage;
   a two beam interference optical system including a shutter-less reference path, wherein the two beam interference optical system includes:
     an illumination source;
     a reference mirror configured to reflect substantially less light from a center region than from a peripheral region; and
     a first beam splitter configured to direct a first portion of light from the illumination source along an object path to the surface of one or more specimens disposed on the specimen stage and a second portion of light from the illumination source along the shutter-less reference path to the surface of the reference mirror,
     wherein the first beam splitter is configured to direct a portion of light reflected from the peripheral regions of the surface of the reference mirror along a primary optical axis,
     wherein the camera and reference mirror are arranged such that light reflected from peripheral regions of the reference mirror does not impinge on a field of view (FOV) of the camera;
   an autofocusing system disposed along a secondary optical axis, wherein the autofocusing system is configured to analyze one or more interference fringes created by a superposition of light reflected from the surface of the specimen and light reflected from the peripheral region of the surface of the reference mirror simultaneously with an imaging of the surface of the one or more specimens by the camera.

2. The apparatus of claim 1, further comprising:
   a focus height controller configured to adjust a Z height position based on a received instruction signal from one or more computer systems.

3. The apparatus of claim 2, wherein the focus height controller configured to adjust a Z height position based on a received instruction signal from one or more computer systems comprises:
   a focus height controller configured to adjust a Z height position based on a received instruction signal from one or more computer systems programmed to execute an algorithm configured to determine the best focus position based on the analyzed one or more interference fringes.

4. The apparatus of claim 1, wherein the reference mirror is configured to reflect substantially no light from a center region of the reference mirror.

5. The apparatus of claim 1, wherein the reference mirror includes an opening located substantially at the center region of the reference mirror.

6. The apparatus of claim 1, wherein the reference mirror includes a substantially non-reflective region located substantially at the center region of the reference mirror.

7. The apparatus of claim 1, wherein the reference mirror comprises:
   a substantially planar mirror.

8. The apparatus of claim 1, wherein the two beam interference optical system including a shutter-less reference path comprises:
   a Linnik interferometer.

9. The apparatus of claim 1, wherein the two beam interference optical system including a shutter-less reference path further comprises:
   a main objective having a first end positioned proximate to one or more specimens disposed on the specimen stage, wherein the main objective is configured to focus a portion of light from the illumination source onto the surface of the surface of the specimen.

10. The apparatus of claim 1, wherein the two beam interference optical system including a shutter-less reference path further comprises:
    a reference objective having a first end positioned proximate to a surface of the reference mirror, wherein the reference objective is configured to focus a portion of light from the illumination source onto the surface of the reference mirror.

11. The apparatus of claim 1, further comprising:
    a second beam splitter, wherein the second beam splitter resides along the primary optical axis and is configured to direct a portion of light from the primary optical axis to the autofocus system along the secondary optical axis.

12. The apparatus of claim 1, further comprising:
    one or more computer systems.

13. The apparatus of claim 12, wherein the one or more computer systems are communicatively coupled to the autofocusing system.

14. The apparatus of claim 12, wherein the one or more computer systems are communicatively coupled to the camera.

15. The apparatus of claim 12, further comprising:
    a display device communicatively coupled to the one or more computer systems.

16. The apparatus of claim 1, wherein the camera includes one or more charged coupled devices (CCDs).

17. The apparatus of claim 1, wherein the autofocus system includes a pin diode arrays (PDA).

18. An apparatus suitable for interferometric autofocusing, comprising:
- a camera disposed along a primary optical axis, wherein the camera is configured to collect a portion of light reflected from a surface of one or more specimens disposed on a specimen stage;
- a two beam interference optical system including a shutter-less reference path, wherein the two beam interference optical system includes:
  - an illumination source;
  - a reference mirror;
  - a first beam splitter configured to direct a first portion of light from the illumination source along an object path to the surface of one or more specimens disposed on the specimen stage and a second portion of light from the illumination source along the shutter-less reference path toward the reference mirror; and
  - a ninety degree mirror positioned along the shutter-less reference path between the illumination source and the reference mirror, wherein the ninety degree mirror is configured to divert light impinging on the ninety degree mirror from the shutter-less reference path along a direction substantially perpendicular to the reference path such that substantially no light from the shutter-less reference path impinges a central region of the reference mirror;
  - wherein the first beam splitter is configured to direct a portion of light reflected from the surface of the reference mirror along a primary optical axis,
  - wherein the camera and reference mirror are arranged such that light reflected from peripheral regions of the reference mirror does not impinge on a field of view (FOV) of the camera;
- an autofocusing system disposed along a secondary optical axis, wherein the autofocusing system is configured to analyze one or more interference fringes created by a superposition of light reflected from the surface of the specimen and light reflected from a peripheral region of the surface of the reference mirror simultaneously with an imaging of the surface of the one or more specimens by the camera.

* * * * *